United States Patent
Sasaki et al.

(10) Patent No.: US 11,063,210 B2
(45) Date of Patent: Jul. 13, 2021

(54) SPIN-ORBIT-TORQUE MAGNETIZATION ROTATIONAL ELEMENT, SPIN-ORBIT-TORQUE MAGNETORESISTANCE EFFECT ELEMENT, AND MAGNETIC MEMORY

(71) Applicant: TDK CORPORATION, Tokyo (JP)

(72) Inventors: Tomoyuki Sasaki, Tokyo (JP); Yohei Shiokawa, Tokyo (JP); Eiji Komura, Tokyo (JP); Keita Suda, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/844,249

(22) Filed: Apr. 9, 2020

(65) Prior Publication Data

US 2020/0235290 A1  Jul. 23, 2020

Related U.S. Application Data

(62) Division of application No. 16/178,082, filed on Nov. 1, 2018, now Pat. No. 10,644,228.

(30) Foreign Application Priority Data

Nov. 14, 2017 (JP) .............................. JP2017-219220

(51) Int. Cl.
*G11B 5/31* (2006.01)
*H01L 43/10* (2006.01)
(Continued)

(52) U.S. Cl.
CPC ............ *H01L 43/10* (2013.01); *G11C 11/161* (2013.01); *G11C 11/1675* (2013.01);
(Continued)

(58) Field of Classification Search
CPC ... G11C 11/161; G11C 11/1675; G11C 11/18; H01L 43/10; H01L 43/06; H01L 43/08; G11B 5/3163; G11B 5/3909
See application file for complete search history.

(56) References Cited

U.S. PATENT DOCUMENTS 5,608,593 A  3/1997  Kim et al.
8,350,347 B2  1/2013  Gaudin et al.
(Continued)

FOREIGN PATENT DOCUMENTS

| JP | 2014-045196 A | 3/2014 |
| JP | 2017-059594 A | 3/2017 |
| WO | 2016021468 A1 | 2/2016 |

OTHER PUBLICATIONS

Sep. 11, 2019 Office Action issued in U.S. Appl. No. 16/178,082.
(Continued)

*Primary Examiner* — Thomas L Dickey
(74) *Attorney, Agent, or Firm* — Oliff PLC

(57) ABSTRACT

Provided is a spin-orbit-torque magnetization rotational element that suppresses re-adhesion of impurities during preparation and allows a write current to easily flow. The spin-orbit-torque magnetization rotational element includes a spin-orbit torque wiring that extends in a first direction, and a first ferromagnetic layer that is located on a side of one surface of the spin-orbit torque wiring. A side surface of the spin-orbit torque wiring and a side surface of the first ferromagnetic layer form a continuous inclined surface in any side surface.

12 Claims, 8 Drawing Sheets

(51) Int. Cl.
  G11C 11/18 (2006.01)
  G11C 11/16 (2006.01)
  H01L 43/08 (2006.01)
  H01L 43/06 (2006.01)
  H01F 10/32 (2006.01)
  H01L 43/04 (2006.01)

(52) U.S. Cl.
  CPC .............. G11C 11/18 (2013.01); H01L 43/06 (2013.01); H01L 43/08 (2013.01); *H01F 10/3254* (2013.01); *H01L 43/04* (2013.01)

(56) References Cited

U.S. PATENT DOCUMENTS

| | | | |
|---|---|---|---|
| 2014/0056060 | A1 | 2/2014 | Khvalkovskiy et al. |
| 2014/0170776 | A1 | 6/2014 | Satoh et al. |
| 2015/0348606 | A1 | 12/2015 | Buhrman et al. |
| 2016/0225982 | A1 | 8/2016 | Guo |
| 2017/0076769 | A1 | 3/2017 | Shirotori et al. |
| 2017/0222135 | A1 | 8/2017 | Fukami et al. |
| 2018/0269386 | A1* | 9/2018 | Tsubata ................. G11C 11/161 |

OTHER PUBLICATIONS

Dec. 10, 2019 Interview Summary issued in U.S. Appl. No. 16/178,082.
Miron et al. "Perpendicular switching of a single ferromagnetic layer induced by in-plane current injection." Nature, Aug. 11, 2011, vol. 476, pp. 189-194.
Kato et al. "Observation of the Spin Hall Effect in Semiconductors." Science, Dec. 10, 2004, vol. 306, pp. 1910-1913.
Liu et al. "Spin torque switching with the giant spin Hall effect of tantalum." Science, 2012.
Liu et al. "Current-Induced Switching of Perpendicularly Magnetized Magnetic Layers Using Spin Torque from the Spin Hall Effect." Physical Review Letters, Aug. 31, 2012, vol. 109, pp. 096602-1-096602-5.
Lee et al. "Threshold current for switching of a perpendicular magnetic layer induced by spin Hall effect." Applied Physics Letters, 2013, vol. 102.
Lee et al. "Thermally activated switching of perpendicular magnet by spin-orbit spin torque." Applied Physics Letters, 2014, vol. 104, pp. 072413-1-072412-5.
Fukami et al. "Magnetization switching by spin-orbit torque in an antiferromagnet-ferromagnet bilayer system." Nature Materials, Feb. 15, 2016, vol. 15, pp. 535-542.
Fukami et al. "A spin-orbit torque switching scheme with collinear magnetic easy axis and current configuration." Nature Nanotechnology, Mar. 21, 2016, pp. 1-6.
Takahashi et al. "Spin injection and detection in magnetic nanostructures." Physical Review B, Feb. 28, 2003, vol. 67, pp. 052409-1-052409-4.
Seo et al. "Area-Efficient SOT-MRAM With a Schottky Diode." IEEE Electron Device Letters, Aug. 8, 2016, vol. 37, No. 8, pp. 982-985.
Zhang et al. "Spin Hall Effects in Metallic Antiferromagnets." Physical Review Letters, Nov. 7, 2014, Vo. 113, p. 196602-1-196602-6.

* cited by examiner

SPIN-ORBIT-TORQUE MAGNETIZATION ROTATIONAL ELEMENT, SPIN-ORBIT-TORQUE MAGNETORESISTANCE EFFECT ELEMENT, AND MAGNETIC MEMORY

CROSS REFERENCE TO RELATED APPLICATION

This application is a divisional application of U.S. Ser. No. 16/178,082, filed Nov. 1, 2018, the contents of which are incorporated herein by reference.

BACKGROUND

Field of the Invention

The present disclosure relates to a spin-orbit-torque magnetization rotational element, a spin-orbit-torque magnetoresistance effect element, and a magnetic memory.

Priority is claimed on Japanese Patent Application No. 2017-219220, filed Nov. 14, 2017, the content of which is incorporated herein by reference.

Description of Related Art

A giant magnetoresistance (GMR) element including a multi-layer film of a ferromagnetic layer and a nonmagnetic layer, and a tunnel magnetoresistance (TMR) element using an insulating layer (a tunnel barrier layer, a barrier layer) as a nonmagnetic layer are known. The elements have attracted attention as elements for a magnetic sensor, a high-frequency component, a magnetic head, and a non-volatile RAM (MRAM).

An MRAM reads and writes data by using characteristics in which when magnetization directions of two ferromagnetic layers with an insulating layer interposed therebetween vary, an element resistance of the GMR element or the TMR element varies. As a writing method of the MRAM, a method in which writing (magnetization reversal) is performed by using a magnetic field that is formed by a current, and a method in which writing (magnetization reversal) is performed by using spin transfer torque (STT) that occurs by flowing a current in a lamination direction of a magnetoresistance effect element are known.

In the magnetization reversal of the magnetoresistance effect element using the STT, it is necessary to flow a current in the lamination direction of the magnetoresistance effect element when writing data. A write current may deteriorate characteristics of the magnetoresistance effect element.

Accordingly, methods in which it is not necessary to flow a current in the lamination direction of the magnetoresistance effect element in writing have recently attracted attention. One of the methods is a writing method using spin-orbit torque (SOT) (for example, I. M. Miron, K. Garello, G. Gaudin, P.-J. Zermatten, M. V. Costache, S. Auffret, S. Bandiera, B. Rodmacq, A. Schuhl, and P. Gambardella, Nature, 476,189 (2011)). The SOT is caused by a pure spin current that occurs due to a spin orbit interaction, or a Rashba effect at an interface of different kinds of materials. A current that causes the SOT in the magnetoresistance effect element is flowed in a direction that intersects the lamination direction of the magnetoresistance effect element. That is, it is not necessary to flow a current in the lamination direction of the magnetoresistance effect element, and thus long operational lifespan of the magnetoresistance effect element is expected.

SUMMARY

However, when a magnetization rotational element using the SOT is put into practical use, there are various problems.

For example, one of the problems relates to conductive impurities which adhere to a side wall of the magnetoresistance effect element. The conductive impurities deteriorate magnetic characteristics of a ferromagnetic substance that constitutes the magnetoresistance effect element, and becomes a cause of leakage of the magnetoresistance effect element. The impurities can be removed by irradiating the side wall of the magnetoresistance effect element with ion beams. However, in a case of the magnetoresistance effect element using the SOT, a spin-orbit torque wiring extends in a direction intersecting the lamination direction of the magnetoresistance effect element. When the spin-orbit torque wiring is irradiated with a part of the ion beams, a part of the spin-orbit torque wiring is etched, and adheres again to the side wall of the magnetoresistance effect element. A substance that constitutes the spin-orbit torque wiring having conductivity becomes impurities due to re-adhesion.

Another problem relates to heat generation of the spin-orbit torque wiring. When the spin-orbit torque wiring generates heat, magnetization of the ferromagnetic substance becomes unstable. That is, heat generation of the spin-orbit torque wiring becomes one factor that decreases data coercivity.

The disclosure has been made in consideration of such circumstances, and an object thereof is to provide a spin-orbit-torque magnetization rotational element that suppresses re-adhesion of impurities during preparation and allows a write current to easily flow.

The present inventors have made a thorough investigation, and found that when side surfaces of a spin-orbit torque wiring and a first ferromagnetic layer are set to a continuous inclined surface, it is possible to solve the above-described problems.

That is, the disclosure provides the following means to solve the above-described problems.

(1) According to a first aspect of the disclosure, there is provided a spin-orbit-torque magnetization rotational element including: a spin-orbit torque wiring that extends in a first direction; and a first ferromagnetic layer that is located on a side of one surface of the spin-orbit torque wiring. A side surface of the spin-orbit torque wiring and a side surface of the first ferromagnetic layer form a continuous inclined surface in any side surface.

(2) In the spin-orbit-torque magnetization rotational element according to the aspect, an inclination angle of a first inclined surface including a first side surface of the spin-orbit torque wiring and a first side surface of the first ferromagnetic layer in the first direction with respect to a lamination direction may be greater than an inclination angle of a second inclined surface including a second side surface of the spin-orbit torque wiring and a second side surface of the first ferromagnetic layer, which intersect the first direction, with respect to the lamination direction.

(3) In the spin-orbit-torque magnetization rotational element according to the aspect, the inclination angle of the first inclined surface including the first side surface of the spin-orbit torque wiring and the first side surface of the first ferromagnetic layer in the first direction with respect to the lamination direction may be 45° or greater.

(4) The spin-orbit-torque magnetization rotational element according to the aspect may further include two via wirings extending from a surface of the spin-orbit torque wiring which is opposite to the first ferromagnetic layer. The two via wirings may be located at positions at which the first ferromagnetic layer is sandwiched when viewed from the lamination direction, and may partially overlap the first ferromagnetic layer.

(5) The spin-orbit-torque magnetization rotational element according to the aspect may further include an underlayer between the spin-orbit torque wiring and the first ferromagnetic layer. Side surfaces of the spin-orbit torque wiring, the first ferromagnetic layer, and the underlayer may form a continuous inclined surface in any side surface.

(6) In the spin-orbit-torque magnetization rotational element according to the aspect, the underlayer may be amorphous.

(7) The spin-orbit-torque magnetization rotational element according to the aspect may further include a magnetization control layer between the spin-orbit torque wiring and the first ferromagnetic layer. Side surfaces of the spin-orbit torque wiring, the first ferromagnetic layer, and the magnetization control layer may form a continuous inclined surface in any side surface.

(8) In the spin-orbit-torque magnetization rotational element according to the aspect, a crystal structure of the magnetization control layer may be tetragonal.

(9) According to a second aspect of the disclosure, there is provided a spin-orbit-torque magnetoresistance effect element including: the spin-orbit-torque magnetization rotational element according to the aspect; a second ferromagnetic layer that is disposed to face a side of the first ferromagnetic layer which is opposite to the spin-orbit torque wiring; and a nonmagnetic layer that is interposed between the first ferromagnetic layer and the second ferromagnetic layer.

(10) In the spin-orbit-torque magnetoresistance effect element according to the aspect, the first ferromagnetic layer and the second ferromagnetic layer may have magnetic anisotropy in an in-plane direction, and axes of easy magnetization of the layers may be inclined with respect to the first direction.

(11) According to a third aspect of the disclosure, there is provided a magnetic memory including: a plurality of the spin-orbit-torque magnetoresistance effect elements according to the aspect.

According to the aspects of the disclosure, re-adhesion of impurities during preparation is suppressed, and it is possible to allow a write current to easily flow.

DETAILED DESCRIPTION

Figure 1:
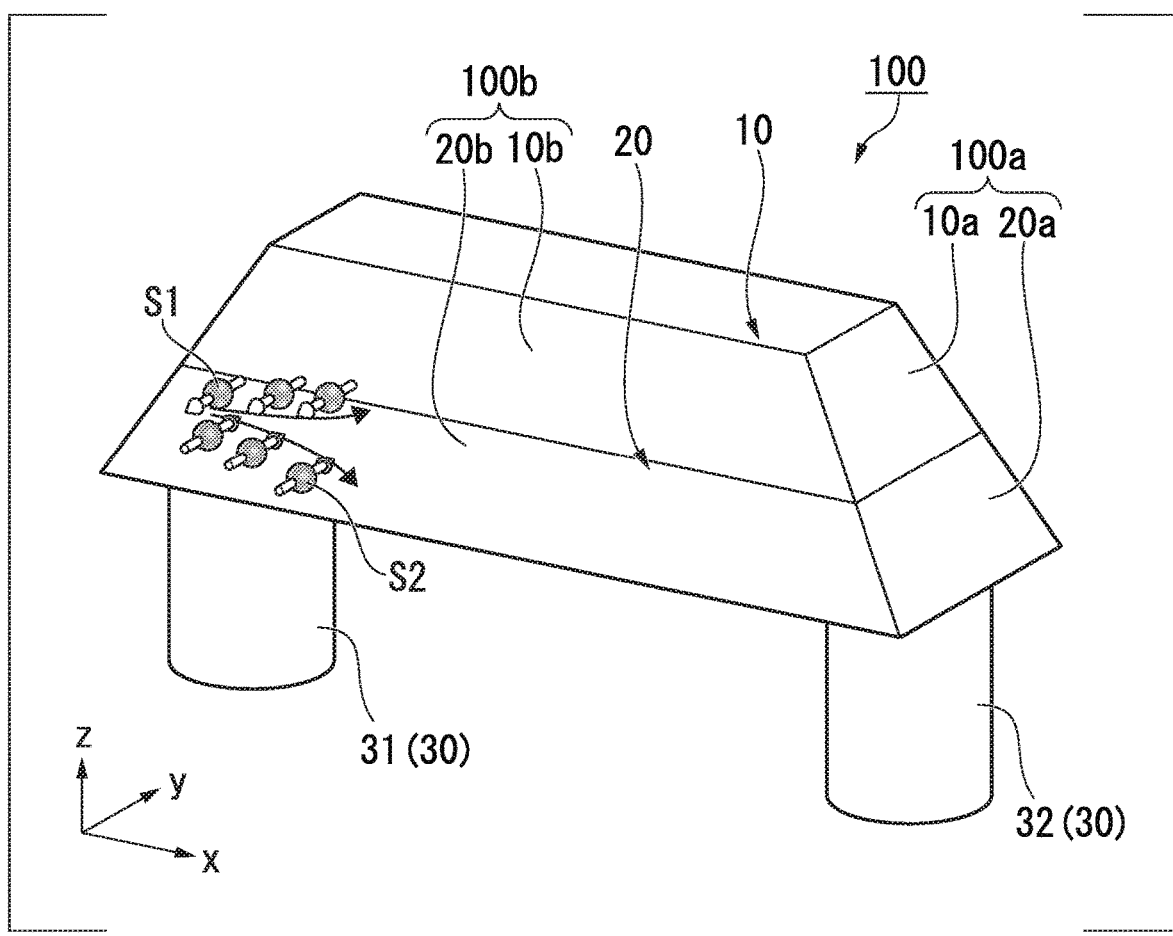
FIG. 1 is a schematic perspective view of a spin-orbit-torque magnetization rotational element according to a first embodiment.

Hereinafter, embodiments of the disclosure will be described in detail with reference to the accompanying drawings. Furthermore, in description of the drawings, the same reference numeral will be given to the same element, and redundant description will be omitted.

First Embodiment

Spin-Orbit-Torque Magnetization Rotational Element

Figure 2A:
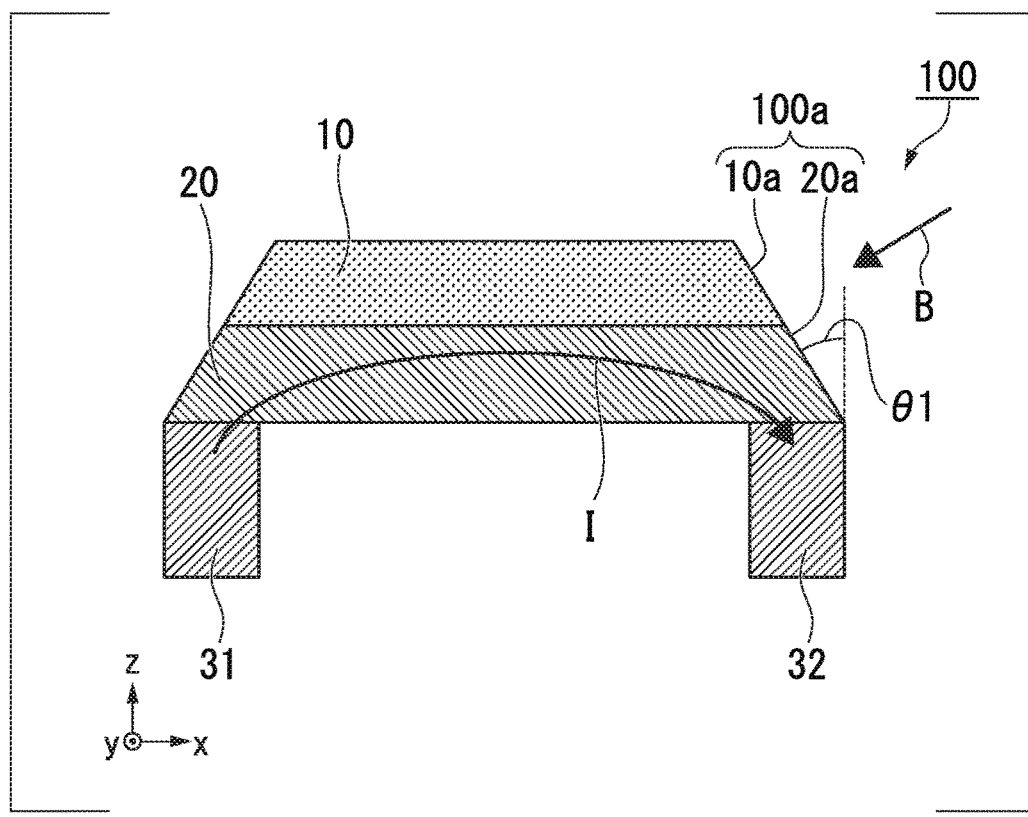
FIGS. 2A and 2B are schematic cross-sectional views of the spin-orbit-torque magnetization rotational element according to the first embodiment.
Figure 2B:
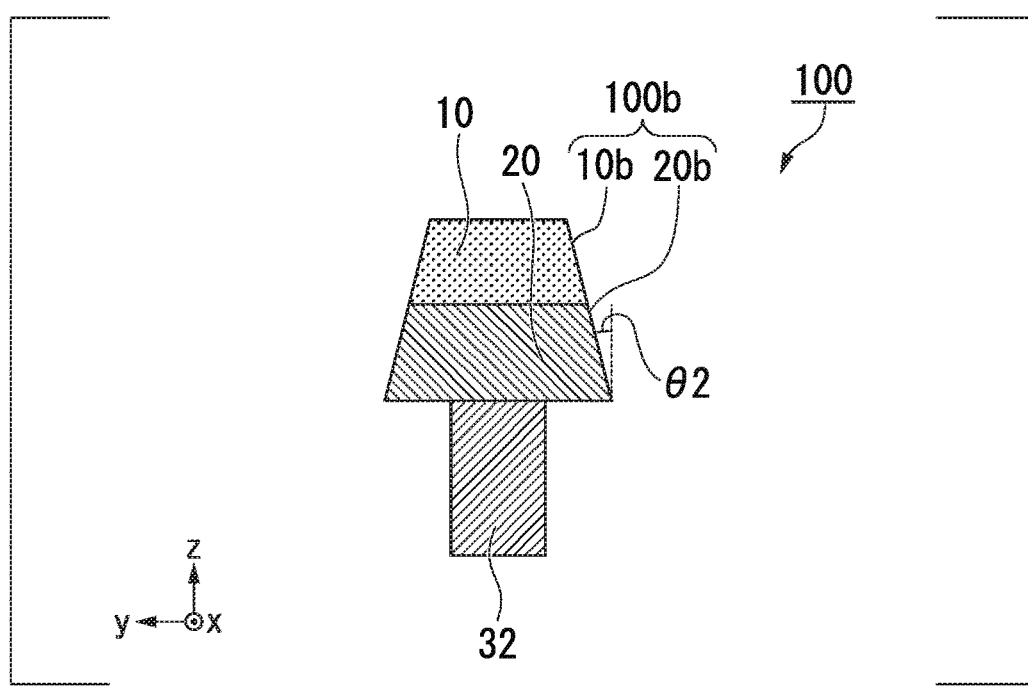

FIG. 1 is a perspective view schematically illustrating a spin-orbit-torque magnetization rotational element according to a first embodiment. In addition, FIGS. 2A and 2B are cross-sectional views schematically illustrating the spin-orbit-torque magnetization rotational element according to the first embodiment.

A spin-orbit-torque magnetization rotational element 100 according to the first embodiment includes a first ferromagnetic layer 10 and a spin-orbit torque wiring 20. In addition, the spin-orbit-torque magnetization rotational element 100 illustrated in FIG. 1 further includes two via wirings 30 (a first via wiring 31 and a second via wiring 32). Hereinafter, a first direction in which the spin-orbit torque wiring 20 extends is defined as an x direction, a second direction that intersects the x direction in a plane in which the spin-orbit torque wiring 20 extends is defined as a y direction, and a direction that intersects the x direction and the y direction is defined as a z direction. A lamination direction of the spin-orbit-torque magnetization rotational element 100 illustrated in FIG. 1 matches the z direction.

First Ferromagnetic Layer

A magnetization direction of the first ferromagnetic layer 10 varies. A ferromagnetic material, particularly, a soft magnetic material is applicable to the first ferromagnetic layer 10. For example, a metal that is selected from the group consisting of Cr, Mn, Co, Fe, and Ni, an alloy that includes one or more kinds of the metals, an alloy that includes the metals, and at least one or more kinds of elements among B, C, and N, and the like can be used as the first ferromagnetic layer 10. Specifically, Co—Fe, Co—Fe—B, and Ni—Fe can be exemplified as the first ferromagnetic layer 10.

As the first ferromagnetic layer 10, a Heusler alloy such as $Co_2FeSi$ may be used. The Heusler alloy includes an intermetallic compound having a chemical composition of $X_2YZ$. Here, X represents a transition metal element such as the group Co, Fe, Ni, or Cu, or a noble metal element in the periodic table, Y represents a transition metal of the group Mn, V, Cr, or Ti, or element species of X, and Z represents a typical element of group III to group V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like. The Heusler alloy has high spin polarization, and thus it is possible to raise an output of the spin-orbit-torque magnetization rotational element 100.

Spin-Orbit Torque Wiring

The spin-orbit torque wiring 20 extends in the x direction. The spin-orbit torque wiring 20 is connected one surface of the first ferromagnetic layer 10 in the z direction. The spin-orbit torque wiring 20 may be directly connected to the first ferromagnetic layer 10, or may be connected to the first ferromagnetic layer 10 through another layer.

The spin-orbit torque wiring 20 is formed from a material in which, when a current flows, a spin current is generated due to a spin Hall effect. With regard a configuration of the material, an arbitrary configuration may be employed as long as a spin current is generated in the spin-orbit torque wiring 20. Accordingly, the configuration may be a configuration including a portion that is constituted by a material that is likely to generate the spin current, and a portion that is constituted by a material that is less likely to generate the spin current without limitation to a material constituted by an elementary element.

The spin Hall effect is a phenomenon in which the spin current is caused in a direction orthogonal to a current direction on the basis of a spin orbit interaction in a case where a current is allowed to flow to a material. Description will be given of a mechanism in which the spin current is generated due to the spin Hall effect.

As illustrated in FIG. 1, when a potential different is applied to both ends of the spin-orbit torque wiring 20 in the x direction, a current flows in the x direction. When the current flows, a first spin S1 that is oriented in one direction, and a second spin S2 that is oriented in a direction opposite to that of the first spin S1 are curved in direction orthogonal to the current. A typical Hall effect and the spin Hall effect are common in that a moving (migrating) charge (electron) can curve a movement (migration) direction. On the other hand, the typical Hall effect and the spin Hall effect are greatly different as follows. In the typical Hall effect, charged particles which move in a magnetic field can curve a movement direction when receiving a Lorentz force. In contrast, in the spin Hall effect, a movement direction of a spin can be curved only when an electron moves (a current flows) even though a magnetic field does not exist.

In a nonmagnetic substance (material that is not a ferromagnetic substance), the number of electrons of the first spin S1 and the number of electrons of the second spin S2 are the same as each other, and thus the number of electrons of the first spin S1 that faces a +z direction in the drawing, and the number of electrons of the second spin S2 that faces a −z direction are the same as each other. In this case, flows of charges cancel each other, and thus the amount of current becomes zero. A spin current that is not accompanied with a current is particularly referred to as a pure spin current.

When a flow of electrons of the first spin S1 is set as $J_\uparrow$, a flow of electrons of the second spin S2 is set as $J_\downarrow$, and a spin current is set as $J_S$, $J_S$ is defined as $J_\uparrow - J_\downarrow$. The spin current $J_S$ flows in the z direction in the drawing. In FIG. 1, when a ferromagnetic substance is brought into contact with an upper surface of the spin-orbit torque wiring 20, the spin current is diffused and flows into the ferromagnetic substance. That is, a spin is injected into the first ferromagnetic layer 10.

The spin-orbit torque wiring 20 is constituted by any one of a metal, an alloy, an intermetallic compound, a metal boride, a metal carbide, a metal silicide, and a metal phosphide which have a function of generating a spin current due to the spin Hall effect when a current flows.

It is preferable that a main configuration of the spin-orbit torque wiring 20 is a nonmagnetic heavy metal. Here, the heavy metal is a metal having a specific gravity equal to or greater than the specific gravity of yttrium. It is preferable that the nonmagnetic heavy metal is a nonmagnetic metal that has an atomic number as high as 39 or greater and has a "d" electron or an "f" electron in the outermost shell. In the nonmagnetic metal, a spin orbit interaction that causes the spin Hall effect to occur is great.

Typically, an electron has no relation with a direction of a spin thereof, and moves in a direction opposite to a direction of a current. In contrast, in a nonmagnetic metal that has a high atomic number and has the "d" electron or the "f" electron in the outermost shell, the spin orbit interaction is great, and the spin Hall effect strongly operates. According to this, a movement direction of an electron depends on a direction of a spin of the electron. Accordingly, the spin current $J_S$ is likely to occur in the nonmagnetic heavy metal.

In addition, the spin-orbit torque wiring 20 may include a magnetic metal. The magnetic metal is a ferromagnetic metal, or an antiferromagnetic metal. When a slight amount of magnetic metal is included in the nonmagnetic metal, spin scattering is caused. When the spin is scattered, the spin orbit interaction is enhanced, and thus spin current generation efficiency with respect to a current is raised. The main configuration of the spin-orbit torque wiring 20 may be constituted by only the antiferromagnetic metal.

On the other hand, when the amount of the magnetic metal added is excessive, the spin current is scattered due to the added magnetic metal. As a result, an action of reducing the spin current may be strong. According to this, it is preferable that a molar ratio of the magnetic metal that is added is sufficiently smaller than a total molar ratio of elements which constitute the spin-orbit torque wiring. It is preferable that the molar ratio of the magnetic metal that is added is 3% or less of the total molar ratio.

The spin-orbit torque wiring 20 may include a topological insulator. The topological insulator is a substance of which the inside is an insulator or a high resistor, but a spin-polarized metal state occurs on a surface thereof. In the substance, an internal magnetic field occurs due to a spin orbit interaction. Accordingly, even though an external magnetic field does not exist, a new topological phase is exhibited due to an effect of the spin orbit interaction. This phase is the topological insulator, and it is possible to generate the pure spin current with high efficiency due to strong spin orbit interaction and collapse of reversal symmetry at an edge.

As the topological insulator, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, and the like are preferable. The topological insulators can generate a spin current with high efficiency.

Via Wiring

The via wirings 30 extend from a surface of the spin-orbit torque wiring 20, which is opposite to the first ferromagnetic layer 10, in a direction that intersects the spin-orbit torque wiring 20. In FIG. 1, each of the via wirings 30 extends in a vertical direction of the spin-orbit torque wiring 20. An end of the via wiring 30, which is opposite to the spin-orbit torque wiring 20, is connected to, for example, a semiconductor circuit. For example, a transistor, a resistive element, a capacitor, and the like are connected to the semiconductor circuit to which the via wiring 30 is connected.

Figure 3:
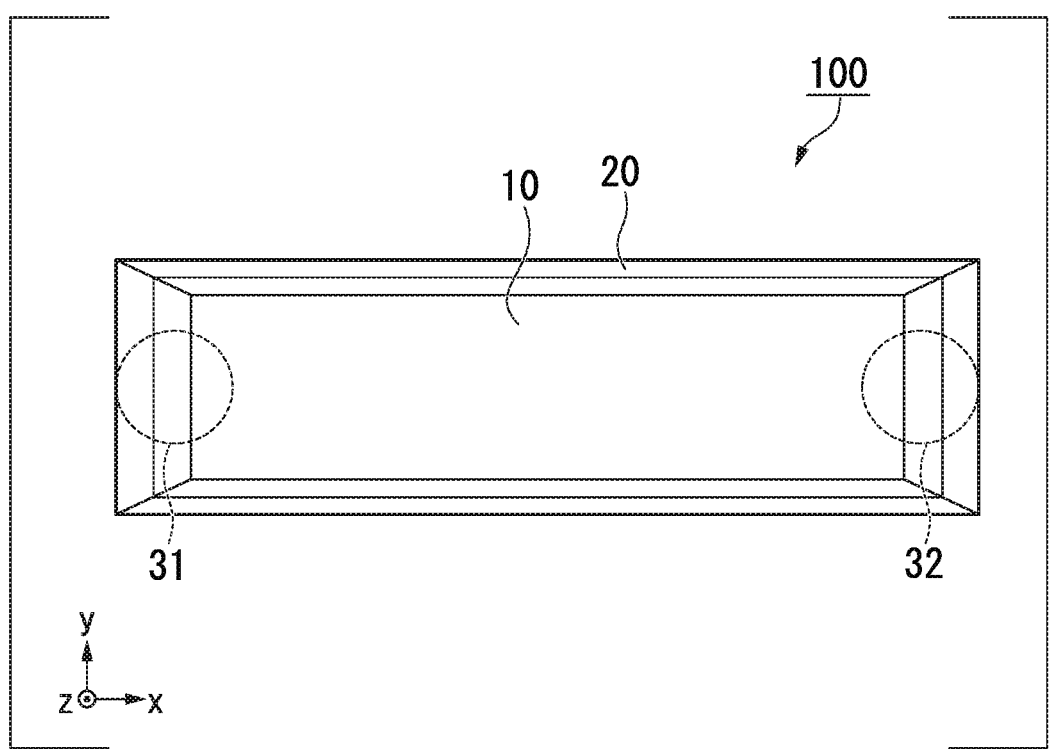
FIG. 3 is a schematic plan view of the spin-orbit-torque magnetization rotational element according to the first embodiment.

FIG. 3 is a schematic plan view of the spin-orbit-torque magnetization rotational element according to the first embodiment. As illustrated in FIG. 3, the first via wiring 31 and the second via wiring 32 are located at positions at which the first ferromagnetic layer 10 is sandwiched when viewed from the z direction. In addition, the first via wiring 31 and the second via wiring 32 partially overlap the first ferromagnetic layer 10 when viewed from the z direction.

In a case where the first ferromagnetic layer 10 and the via wiring 30 do not overlap each other when viewed from the z direction, an area obtained by adding an area of the first ferromagnetic layer 10 and an area of the via wirings 30 is necessary for one element. In contrast, when the via wiring 30 and the first ferromagnetic layer 10 partially overlap when viewed from the z direction, the area necessary for the one element is reduced by the overlapping area. That is, it is possible to integrate a plurality of elements in an integrated circuit in a more efficient manner.

A width of the via wiring 30 in the x direction and the y direction is designed, and cannot be freely changed. For example, a minimum processing size (feature size: F) in a current semiconductor is set to 7 nm, and thus the width of the via wirings 30 in the x direction and the y direction is at least 7 nm. In other words, it is difficult to reduce the width of the via wiring 30 in the x direction and the y direction past this size, and it is difficult to raise the integration by changing the area of the via wiring 30.

A material with high conductivity can be used in the via wiring 30. Examples of the material include copper, aluminum, silver, and the like. In addition, a nitride film with conductivity, and the like can be used.

A portion between the two via wirings 30 is insulated by an interlayer insulating part. The interlayer insulating part is an insulating layer that insulates a portion between wirings of a multi-layer wiring, or between elements. The same material that is used in a semiconductor device and the like can be used in the interlayer insulating part. For example, a silicon oxide ($SiO_x$), a silicon nitride ($SiN_x$), a silicon carbide (SiC), a chromium nitride (CrN), a silicon carbonitride (SiCN), a silicon oxynitride (SiON), an aluminum oxide ($Al_2O_3$), a zirconium oxide ($ZrO_x$), and the like are used.

It is preferable that a difference in Vickers hardness between the interlayer insulating part and the via wiring 30 is 3 GPa or less. When the difference in Vickers hardness between the interlayer insulating part and the via wiring 30 is 3 GPa or less, it is possible to make a polishing state of a lamination surface, on which the spin-orbit torque wiring 20 and the like are laminated, constant by chemical mechanical polishing (CMP) and the like. As a result, it is possible to planarize the lamination surface on which the spin-orbit torque wiring 20 is laminated. In addition, when the lamination surface is planarized, flatness of a lamination surface on which the first ferromagnetic layer 10 is laminated also increases.

As a specific combination in which the difference in the Vickers hardness between the interlayer insulating part and the via wiring 30 is 3 GPa or less, the following combination can be considered.

For example, in a case where the interlayer insulating part is the silicon oxide, a vanadium nitride can be used in the via wiring 30.

In addition, for example, in a case where the interlayer insulating part is the zirconium oxide, a nitride including any one selected from the group consisting of Nb, V, and Al can be used in the via wiring 30.

In addition, for example, in a case where the interlayer insulating part is the silicon nitride, a nitride including any one selected from the group consisting of Nb, Zr, and Al can be used in the via wiring 30.

In addition, for example, in a case where the interlayer insulating part is any one among the chromium nitride, the silicon carbonitride, and the aluminum oxide, a nitride including Ti or Zr can be used in the via wiring 30.

Overall

A side surface of the spin-orbit torque wiring 20 and a side surface of the first ferromagnetic layer 10 form a continuous inclined surface in any side surface. The inclined surface may be a flat surface illustrated in FIG. 1 and FIGS. 1A and 2B, or a curved surface.

Here, the "continuous inclined surface" represents that one inclined surface is formed by the two side surfaces. That is, the side surface of the spin-orbit torque wiring 20 and the side surface of the first ferromagnetic layer 10 are continuously connected to each other. Here, "continuously connected to each other" represents that a fitting line (a straight line or a curved line) that conforms to the inclined surface can be drawn on a section surface that is cut out along an xz plane or a yz plane. In addition, in a case where the inclined surface has unevenness that is 10% or less of the thickness of the spin-orbit torque wiring 20 with respect to the fitting line, the unevenness can be regarded as an error. That is, even in a case where the inclined surface has the minute unevenness, it can be said that the side surface of the spin-orbit torque wiring 20 and the side surface of the first ferromagnetic layer 10 constitute the "continuous inclined surface".

As illustrated in FIGS. 2A and 2B, in the first ferromagnetic layer 10, a first side surface 10a in the x direction and a second side surface 10b in the y direction are inclined with respect to the z direction. In the spin-orbit torque wiring 20, a first side surface 20a in the x direction and a second side surface 20b in the y direction are also inclined with respect to the z direction. The first side surface 10a of the first ferromagnetic layer 10 and the first side surface 20a of the spin-orbit torque wiring 20 form a first inclined surface 100a. The second side surface 10b of the first ferromagnetic layer 10 and the second side surface 20b of the spin-orbit torque wiring 20 form a second inclined surface 100b. Here, the spin-orbit-torque magnetization rotational element 100 includes two side surfaces in each of the x direction and the y direction. The first inclined surface 100a and the second inclined surface 100b may be arbitrary side surfaces in the side surfaces in the respective directions. The two side surfaces in the x direction have the same shape and are different only in an inclination direction. This is also true of the two side surfaces in the y direction.

Figure 4A:
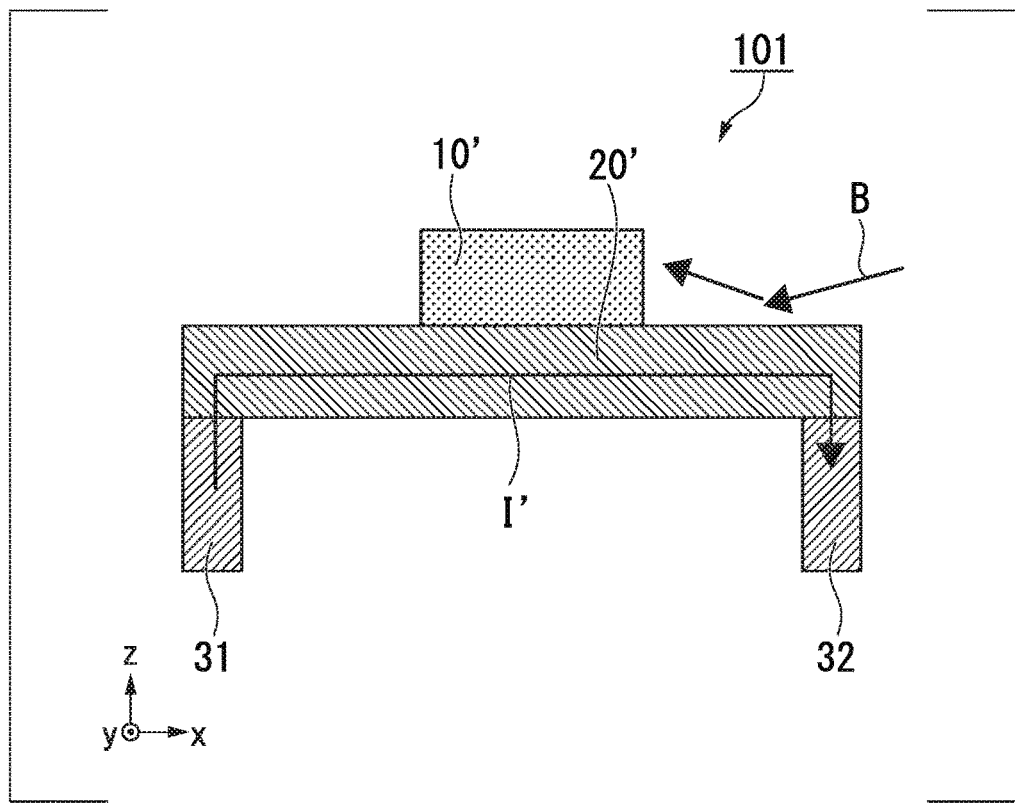
FIGS. 4A and 4B are schematic cross-sectional views of the spin-orbit-torque magnetization rotational element that does not include an inclined surface that is continuous with a side surface.
Figure 4B:
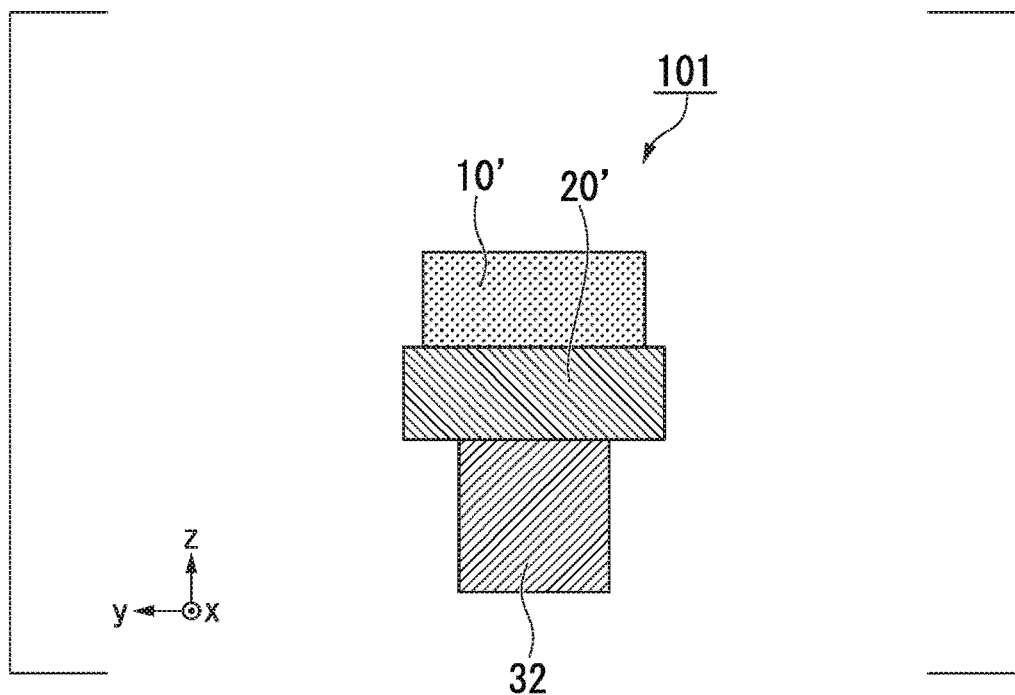

In a case where all of the side surfaces of the spin-orbit-torque magnetization rotational element 100 have a continuous inclined surface, there are a plurality of advantages. FIGS. 4A and 4B are schematic cross-sectional views of a spin-orbit-torque magnetization rotational element 101 that does not have a continuous inclined surface. The spin-orbit-torque magnetization rotational element 101 illustrated in FIGS. 4A and 4B includes a first ferromagnetic layer 10' having a rectangular shape in a plan view, and a spin-orbit torque wiring 20' that extends in the x direction. The first ferromagnetic layer 10' is disposed at the central portion of the spin-orbit torque wiring 20' in the x direction. Description will be given of an advantage obtained when the spin-orbit-torque magnetization rotational element 100 includes a continuous inclined surface at side surfaces while making a comparison with the spin-orbit-torque magnetization rotational element 101 illustrated in FIG. 4.

When the continuous inclined surface is provided, a write current is likely to flow. The write current flows from the first via wiring 31 to the second via wiring 32 through the spin-orbit torque wiring 20. Electric resistance R of the spin-orbit torque wiring 20 is expressed by $R=\rho L/A$. $\rho$ represents electric resistivity, L represents a length in the x direction, and A is a cross-sectional area of the spin-orbit torque wiring 20 when being cut out along the yz plane.

As illustrated in FIG. 2A, when the first inclined surface 100a is a continuous inclined surface, the cross-sectional area A of the spin-orbit torque wiring 20 gradually increases. That is, the electric resistance R of the spin-orbit torque wiring 20 gradually varies in the x direction, and a flow of a write current I becomes smooth. In addition, since the first inclined surface 100a is also continuous with the first side surface 10a of the first ferromagnetic layer 10, a par to the current also flows to the first ferromagnetic layer 10. When the flow of the write current I becomes smooth, heat generation of the spin-orbit torque wiring 20 is suppressed.

In contrast, in a case of the spin-orbit-torque magnetization rotational element 101 illustrated in FIG. 4A, a flow of a write current I' is not smooth. The first via wiring 31, the second via wiring 32, and the spin-orbit torque wiring 20' are different in electric resistivity. According to this, when flowing from the first via wiring 31 to the spin-orbit torque wiring 20', and when flowing from the spin-orbit torque wiring 20' to the second via wiring 32, flowability of the write current I' rapidly varies, and thus interfacial resistance occurs. As a result, the spin-orbit torque wiring 20' is likely to generate heat.

In addition, when the continuous inclined surface is provided, it is possible to suppress re-adhesion of impurities during preparation. The spin-orbit-torque magnetization rotational element 100 is manufactured by using a lamination technology such as a sputtering method and a chemical vapor deposition method, and a processing technology such as photolithography. For example, after preparing the spin-orbit torque wiring 20, a layer that becomes the base of the first ferromagnetic layer 10 is laminated thereon, and is processed into a shape of the first ferromagnetic layer 10 through photolithography.

During the processing, impurities adhere to the side wall of the first ferromagnetic layer 10 in some cases. The impurities deteriorate magnetic characteristics of the first ferromagnetic layer 10. The impurities are removed through irradiation of ion beams B (refer to FIG. 2A and FIG. 4A) from a lateral side. The ion beams B are incident at an angle to be approximately parallel to the xy plane. An angle that is made between the incident beams and the xy plane can be inclined to approximately 10°.

As illustrated in FIG. 2A, when the first inclined surface 100a and the second inclined surface 100b are inclined, it is easy to irradiate the first inclined surface 100a and the second inclined surface 100b with the ion beams B. That is, the first inclined surface 100a and the second inclined surface 100b can be directly irradiated with the ion beams B, and thus it is possible to efficiently remove the impurities. In addition, the ion beams B may scatter a part of the spin-orbit torque wiring 20. The spin-orbit torque wiring 20 has conductivity, and thus re-adhered scattering matters deteriorate magnetic characteristics of the first ferromagnetic layer 10. However, when the side surfaces of the first ferromagnetic layer 10 and the spin-orbit torque wiring 20 form a continuous inclined surface, it is possible to suppress the scattering matters from adhering again to a side wall of the first ferromagnetic layer 10.

In contrast, as illustrated in FIGS. 4A and 4B, when positions of the side surface of the first ferromagnetic layer 10' and the side surface of the spin-orbit torque wiring 20' in the x direction or the y direction are different from each other, it is difficult to irradiate a lower portion of the side surface of the first ferromagnetic layer 10' with the ion beams B. In addition, scattering matters which scatter from the spin-orbit torque wiring 20' are likely to adhere to the first ferromagnetic layer 10' again.

It is preferable that an inclination angle θ1 of the first inclined surface 100a with respect to the z direction is greater than an inclination angle θ2 of the second inclined surface 100b with respect to the z direction (refer to FIGS. 2A and 2B). Here, the first inclined surface 100a or the second inclined surface 100b may be a curved surface, and an inclination angle thereof may not be constant in some cases. In this case, magnitude comparison is performed by using average inclination angles.

For example, an average inclination angle of the first inclined surface 100a is obtained as follows. First, the first inclined surface 100a on the xz plane is divided into five parts in the x direction. Six line segments which extend in the z direction are necessary for division into five parts in the x direction. Then, an angle that is made between a tangential line that passes through an intersection between each of the six line segments and the first inclined surface 100a, and the z direction is obtained at each intersection. Then, an average value of the angles is set as an average inclination angle. An average inclination angle of the second inclined surface 100b can be obtained in the same procedure except that the second inclined surface 100b on the yz plane is divided into five parts in the y direction.

A main direction of a current flow is the x direction. In addition, the spin-orbit torque wiring 20 extends in the x direction, and thus scattering matters are likely to adhere again in the x direction. When the inclination angle θ1 of the first inclined surface 100a is set to greater than the inclination angle θ2 of the second inclined surface 100b, flowability of a current is further improved, and thus it is possible to further suppress re-adhesion of the scattering matters.

In addition, in the spin-orbit-torque magnetization rotational element 100, data is retained depending on a situation in which magnetization of the first ferromagnetic layer 10 faces which direction. When a total amount of magnetization of the first ferromagnetic layer 10 is great, data is stably retained. A total amount of magnetization of the first ferromagnetic layer 10 has a correlation with a volume of the first ferromagnetic layer 10. A length of the spin-orbit-torque magnetization rotational element 100 in the x direction is longer than a length thereof in the y direction. According to this, in a case where the inclination angle θ1 is greater than the inclination angle θ2, it is possible to secure a great volume of the first ferromagnetic layer 10. That is, in a case where the inclination angle θ1 is greater than the inclination angle θ2, data retention characteristics of the spin-orbit-torque magnetization rotational element 100 are improved.

It is preferable that the inclination angle θ1 of the first inclined surface 100a with respect to the z direction is 45° or greater, more preferably 50° or greater, and still more preferably 60° or greater. It is preferable that the inclination angle θ2 of the second inclined surface 100a with respect to the z direction is 10° or greater, more preferably 20° or greater, and still more preferably 30° or greater. When the inclination angle θ1 and the inclination angle θ2 are within the ranges, it is possible to sufficiently suppress re-adhesion of the scattering matters. In addition, it is easy to secure a size of the first ferromagnetic layer 10 sufficient for data retention.

Figure 5A:
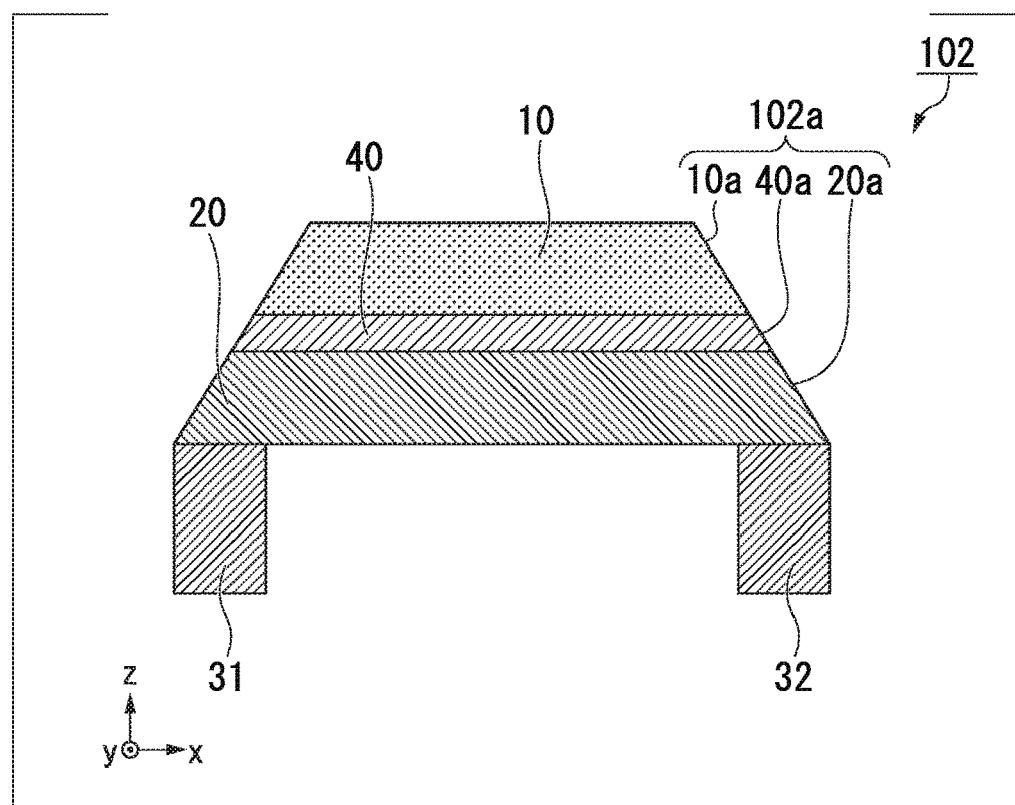
FIGS. 5A and 5B are schematic cross-sectional views of another example of the spin-orbit-torque magnetization rotational element according to the first embodiment.
Figure 5B:
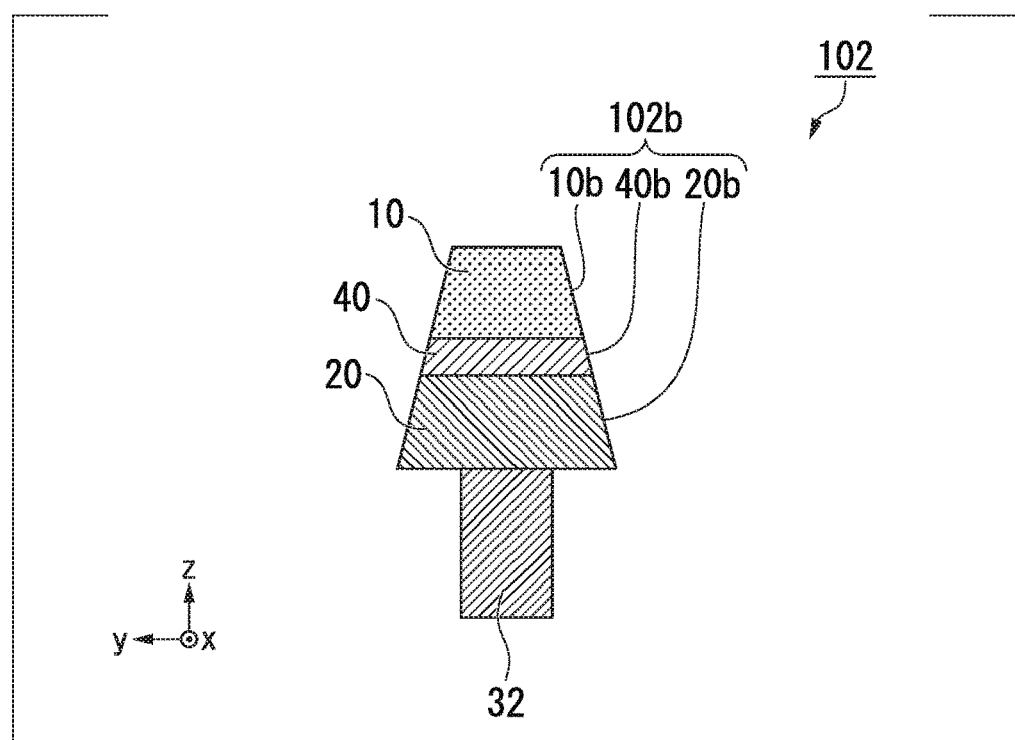

In addition, the spin-orbit-torque magnetization rotational element 100 according to this embodiment is not limited to the configuration illustrated in FIGS. 2A and 2B. FIGS. 5A and 5B are schematic cross-sectional views of another example of the spin-orbit-torque magnetization rotational element according to the first embodiment. A spin-orbit-torque magnetization rotational element 102 illustrated in FIGS. 5A and 5B includes an underlayer 40 between the spin-orbit torque wiring 20 and the first ferromagnetic layer 10. Side surfaces of the spin-orbit torque wiring 20, the first ferromagnetic layer 10, and the underlayer 40 form a continuous inclined surface in any side surface.

A first inclined surface 102a includes the first side surface 10a of the first ferromagnetic layer 10, the first side surface 20a of the spin-orbit torque wiring 20, and a first side surface 40a of the underlayer 40. A second inclined surface 102b includes the second side surface 10b of the first ferromagnetic layer 10, the second side surface 20b of the spin-orbit torque wiring 20, and a second side surface 40b of the underlayer 40. A relationship between the first inclined surface 102a and the second inclined surface 102b is the same as the relationship between the first inclined surface 100a and the second inclined surface 100b illustrated in FIGS. 2A and 2B.

The underlayer 40 is a layer that mitigates an influence on crystal growth of the first ferromagnetic layer 10 by a crystal lattice of the spin-orbit torque wiring 20. When the underlayer 40 is provided, it is possible to reduce the influence of a crystal structure of the spin-orbit torque wiring 20, and thus it is easy to design the crystal structure of the first ferromagnetic layer 10. As a result, it is easy to set an axis of easy magnetization of the first ferromagnetic layer 10 in an arbitrary direction. For example, when the axis of easy magnetization of the first ferromagnetic layer 10 is set to the z direction, a data recording density is raised. In addition, when the axis of easy magnetization of the first ferromagnetic layer 10 is set to any one direction in an xy plane, a data writing speed becomes fast.

For example, a metal or an alloy that includes one or more elements selected from the group consisting of Ti, Cr, Cu, Zn, Mg, Al, Si, B, and C can be used in the underlayer 40. The underlayer 40 is preferably amorphous.

Figure 6A:
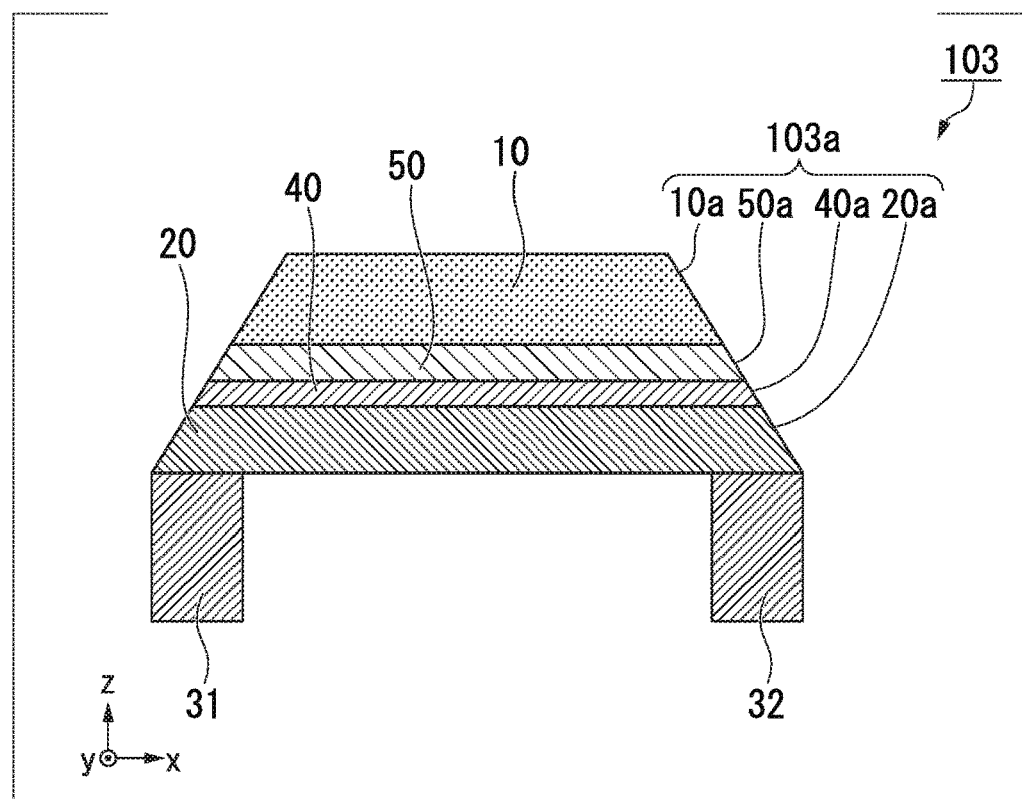
FIGS. 6A and 6B are schematic cross-sectional views of still another example of the spin-orbit-torque magnetization rotational element according to the first embodiment.
Figure 6B:
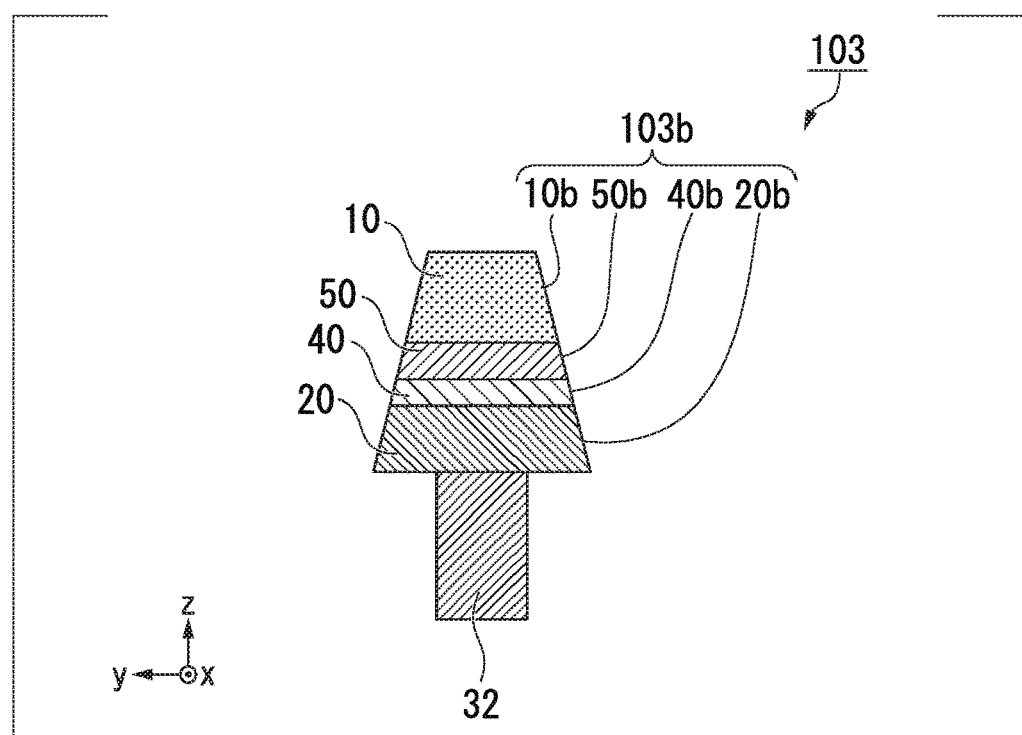

In addition, FIGS. 6A and 6B are schematic cross-sectional views of still another example of the spin-orbit-torque magnetization rotational element according to the first embodiment. A spin-orbit-torque magnetization rotational element 103 illustrated in FIGS. 6A and 6B includes the underlayer 40 and a magnetization control layer 50 between the spin-orbit torque wiring 20 and the first ferromagnetic layer 10. Side surfaces of the spin-orbit torque wiring 20, the first ferromagnetic layer 10, the underlayer 40, and the magnetization control layer 50 form a continuous inclined surface in any side surface.

A first inclined surface 103a includes the first side surface 10a of the first ferromagnetic layer 10, the first side surface 20a of the spin-orbit torque wiring 20, the first side surface 40a of the underlayer 40, and a first side surface 50a of the magnetization control layer 50. A second inclined surface 103b includes the second side surface 10b of the first ferromagnetic layer 10, the second side surface 20b of the spin-orbit torque wiring 20, the second side surface 40b of the underlayer 40, and a second side surface 50b of the magnetization control layer 50. A relationship between the first inclined surface 103a and the second inclined surface 103b is the same as the relationship between the first inclined surface 100a and the second inclined surface 100b illustrated in FIGS. 2A and 2B.

The magnetization control layer 50 is a layer that controls a magnetization direction of the first ferromagnetic layer 10. The first ferromagnetic layer 10 is laminated to maintain a lattice matching property with the magnetization control layer 50. According to this, a crystal structure of the first ferromagnetic layer 10 is similar to a crystal structure of the magnetization control layer 50, and a direction of an axis of easy magnetization is likely to be the same direction as in the magnetization control layer 50.

For example, in a case where the crystal structure is tetragonal, an easy magnetization direction is likely to be oriented in a c-axis direction. According to this, when the crystal structure of the magnetization control layer 50 is set to a tetragon in which a c-axis is oriented in an xy plane, the magnetization control layer 50 becomes an in-plane magnetization film. In addition, the crystal structure of the first ferromagnetic layer 10 is also similar to that of the magnetization control layer 50, and thus the first ferromagnetic layer 10 is also likely to be an in-plane magnetization film. A tetragonal structure in which the c-axis is oriented in the xy plane can be prepared by growing the magnetization control layer 50 while applying a magnetic field in a direction in the xy plane.

When laminating the first ferromagnetic layer 10, when a magnetic field is applied in a predetermined direction, a magnetization orientation direction of the first ferromagnetic layer 10 can be controlled even though the magnetization control layer 50 is not provided. However, when the role of the magnetization control layer 50 and the role of the first ferromagnetic layer 10 are discriminated, selectivity of a material that is used in the first ferromagnetic layer 10 is raised, and thus it is possible to enhance characteristics of the first ferromagnetic layer 10.

$SmFe_{12}$, and the like can be used in the magnetization control layer 50

In addition, the spin-orbit-torque magnetization rotational element 103 illustrated in FIGS. 6A and 6B includes the underlayer 40 between the spin-orbit torque wiring 20 and the magnetization control layer 50. When the underlayer 40 is provided, it is easy to control the crystal structure of the magnetization control layer 50. In addition, only the magnetization control layer 50 may be disposed between the spin-orbit torque wiring 20 and the first ferromagnetic layer 10 without providing the underlayer 40.

As described above, in the spin-orbit-torque magnetization rotational elements according to this embodiment, the side surfaces are continuous inclined surfaces, and thus it is possible to suppress re-adhesion of impurities during preparation. As a result, it is possible to allow the write current to easily flow.

Second Embodiment

Spin-Orbit-Torque Magnetoresistance Effect Element

Figure 7A:
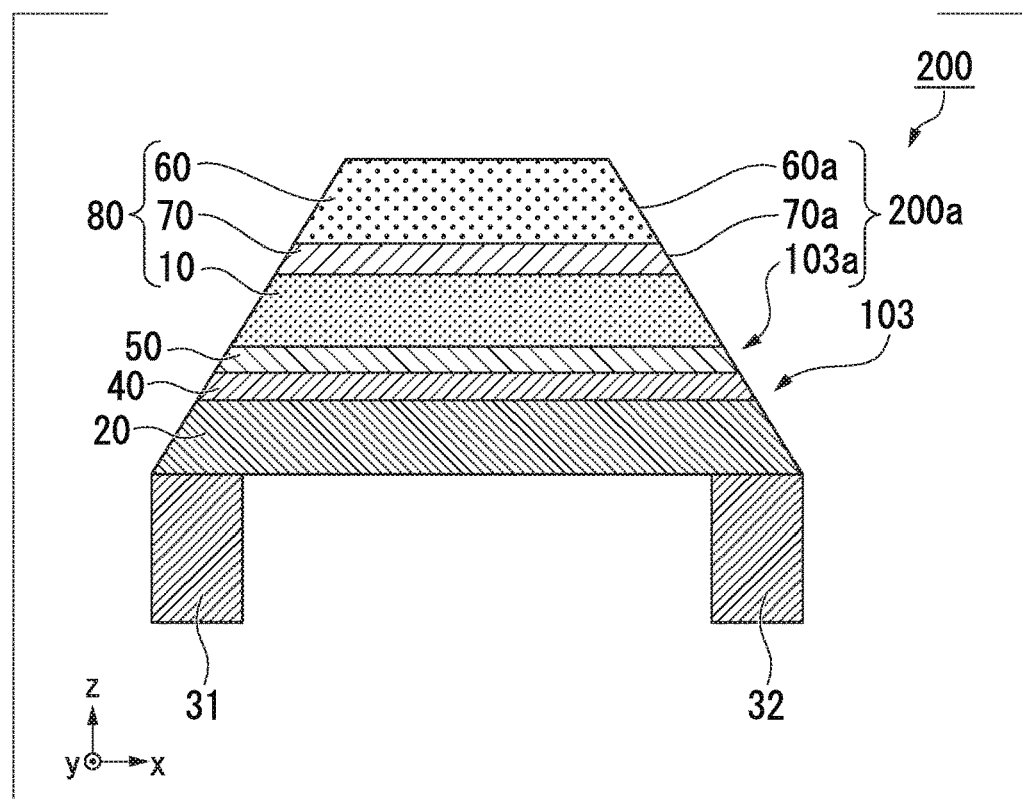
FIGS. 7A and 7B are schematic cross-sectional views of a spin-orbit-torque magnetoresistance effect element according to a second embodiment.
Figure 7B:
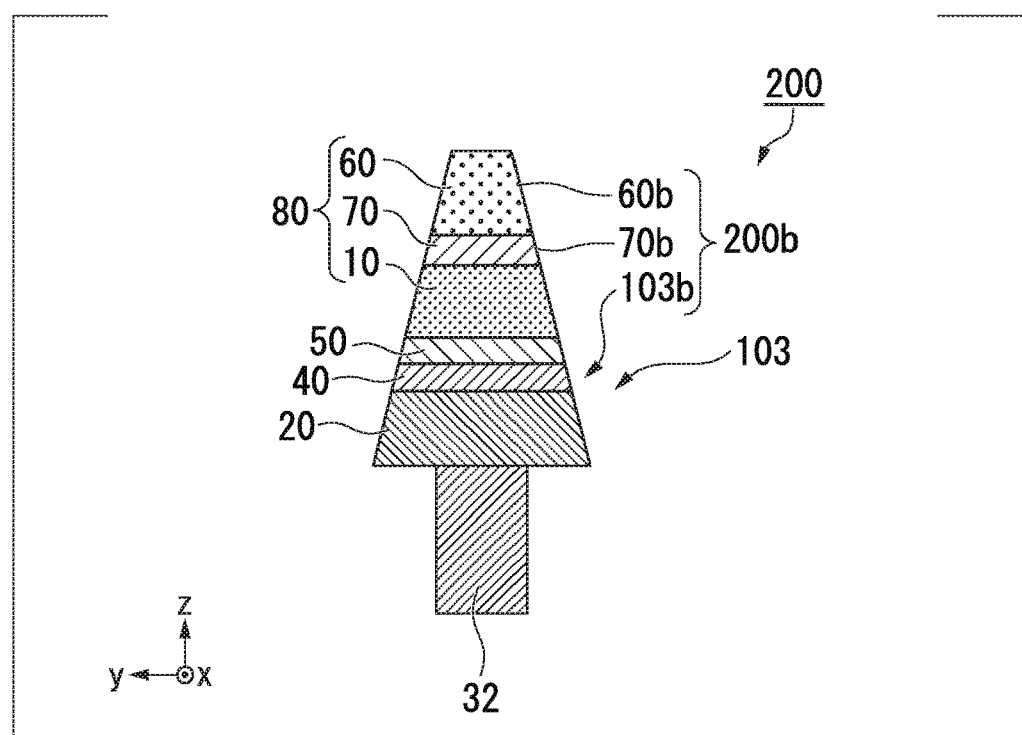

FIGS. 7A and 7B are schematic cross-sectional views of a spin-orbit-torque magnetoresistance effect element according to a second embodiment. A spin-orbit-torque magnetoresistance effect element 200 illustrated in FIGS. 7A and 7B includes the spin-orbit-torque magnetization rotational element 103 illustrated in FIGS. 6A and 6B, a second ferromagnetic layer 60, and a nonmagnetic layer 70. The second ferromagnetic layer 60 is disposed to face a side of the first ferromagnetic layer 10 which is opposite to the spin-orbit torque wiring 20. The nonmagnetic layer 70 is interposed between the first ferromagnetic layer 10 and the second ferromagnetic layer 60. In addition, the spin-orbit-torque magnetization rotational element 103 is illustrative only, and the configurations illustrated in FIGS. 2A and 2B, and FIGS. 5A and 5B may be used.

A laminated body (functional part 80) in which the first ferromagnetic layer 10, the nonmagnetic layer 70, and the second ferromagnetic layer 60 are laminated functions in the same manner as in a typical magnetoresistance effect element. The functional part 80 functions when magnetization of the second ferromagnetic layer 60 is fixed to one direction (z direction), and a magnetization direction of the first ferromagnetic layer 10 relatively varies. In a case of being applied to a coercivity different type (pseudo spin valve type) MRAM, coercivity of the second ferromagnetic layer 60 is set to be greater than the coercivity of the first ferromagnetic layer 10. In a case of being applied to an exchange bias type (spin valve type) MRAM, magnetization of the second ferromagnetic layer 60 is fixed by exchange coupling with an antiferromagnetic layer.

In addition, in a case where the nonmagnetic layer 70 is constituted by an insulator, the functional part 80 has the same configuration as that of a tunneling magnetoresistance (TMR) element, and in a case where the nonmagnetic layer 70 is constituted by a metal, the functional part 80 has the same configuration as that of the giant magnetoresistance (GMR) element.

As a lamination configuration of the functional part 80, a lamination configuration of a known magnetoresistance effect element can be employed. For example, each layer may include a plurality of layers, or another layer such as an antiferromagnetic layer for fixing a magnetization direction of the second ferromagnetic layer 60 may be provided. The second ferromagnetic layer 60 is referred to as a fixing layer or a reference layer, and the first ferromagnetic layer 10 is referred to as a free layer, a storage layer, or the like.

The same material as in the first ferromagnetic layer 10 may be used in the second ferromagnetic layer 60. An antiferromagnetic material such as IrMn and PtMn may be brought into contact with the second ferromagnetic layer 60 to enlarge coercivity of the second ferromagnetic layer 60 with respect to the first ferromagnetic layer 10. in addition, the second ferromagnetic layer 60 may have a synthetic ferromagnetic coupling structure in order for a leakage magnetic field of the second ferromagnetic layer 60 not to have an effect on the first ferromagnetic layer 10.

A known material can be used in the nonmagnetic layer 70.

For example, in a case where the nonmagnetic layer 70 is constituted by an insulator (in a case where the nonmagnetic layer 70 is a tunnel barrier layer), as a material thereof, $Al_2O_3$, $SiO_2$, MgO, $MgAl_2O_4$, and the like can be used. In addition, in addition to these, a material in which a part of Al, Si, or Mg is substituted with Zn, Be, or the like, and the like can be used. Among these, MgO or $MgAl_2O_4$ is a material capable of realizing a coherent tunnel, and thus it is possible to efficiently inject a spin. In a case where the nonmagnetic layer 70 is constituted by a metal, as a material thereof, Cu, Au, Ag, and the like can be used. In addition, in a case where nonmagnetic layer 70 is constituted by a semiconductor, as a material thereof, Si, Ge, $CuInSe_2$, $CuGaSe_2$, Cu(In, Ga)$Se_2$, and the like can be used.

Even in the spin-orbit-torque magnetoresistance effect element 200, the first inclined surface 103a of the spin-orbit-torque magnetization rotational element 103, a first side surface 70a of the nonmagnetic layer 70, and a first side surface 60a of the second ferromagnetic layer 60 form a first continuous inclined surface 200a. In addition, the second inclined surface 103b of the spin-orbit-torque magnetization rotational element 103, a second side surface 70b of the nonmagnetic layer 70, and a second side surface 60b of the second ferromagnetic layer 60 form a second continuous inclined surface 200b. According to this, it is possible to suppress impurities from adhering to the side surfaces of the spin-orbit-torque magnetoresistance effect element 200 again during preparation, and it is possible to allow a write current to easily flow.

In addition, in the spin-orbit-torque magnetoresistance effect element 200, it is preferable that the first ferromagnetic layer 10 and the second ferromagnetic layer 60 are in-plane magnetization films in which a main direction of an axis of easy magnetization is the x direction. In addition, it is preferable that axes of easy magnetization of the layers are inclined with respect to the x direction. When a line segment that connects the first via wiring 31 and the second via wiring 32, and the spin-orbit torque wiring 20 are made to intersect each other, the axes of easy magnetization of the layers are inclined in the y direction with respect to the x direction. In addition, with regard to a positional relationship between the first via wiring 31 and the second via wiring 32, and the spin-orbit torque wiring 20, a magnetization direction may be oriented in a predetermined direction by performing annealing in a magnetic field in a state of the configuration in FIG. 3.

When the first ferromagnetic layer 10 and the second ferromagnetic layer 60 are in-plane magnetization films in which a main direction of the axis of easy magnetization is the x direction, a direction of a spin that is injected into the first ferromagnetic layer 10 and a magnetization direction of the first ferromagnetic layer 10 intersect each other. According to this, response (reaction speed) of the first ferromagnetic layer 10 with respect to the write current is enhanced. In addition, in a case where magnetization of the first ferromagnetic layer 10 has a component in the same direction (y direction) as that of the direction of the spin that is injected into the first ferromagnetic layer 10, a force is applied to a direction in which magnetization of the first ferromagnetic layer 10 is reversed, and thus magnetization reversal is likely to occur. As a result, it is possible to reverse the magnetization of the first ferromagnetic layer 10 without applying an external magnetic field.

Third Embodiment

Magnetic Memory

Figure 8:
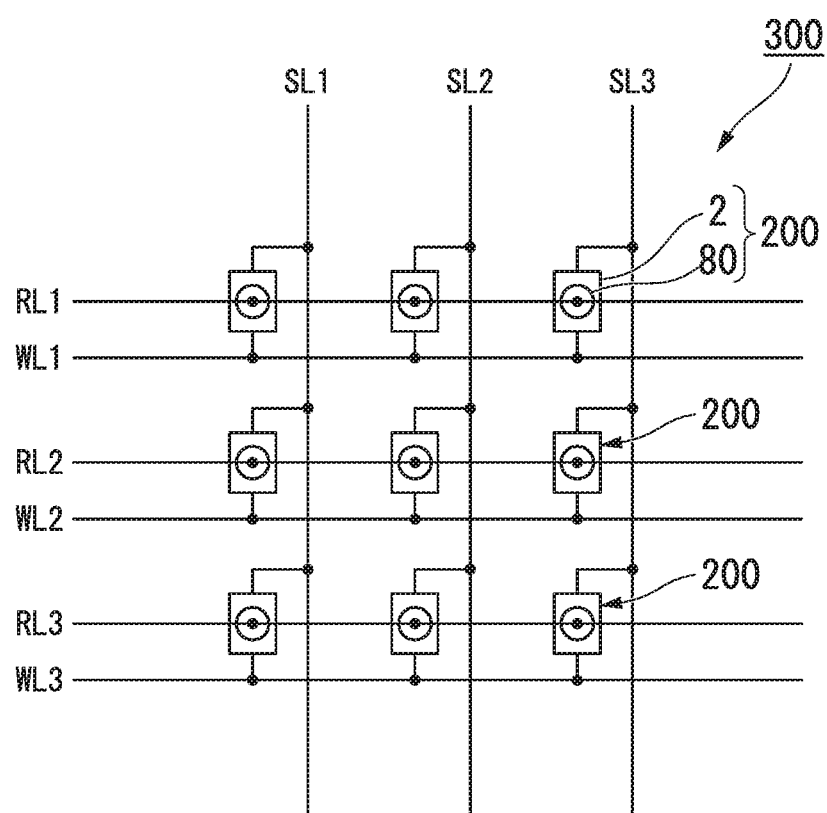
FIG. 8 is a schematic view of a magnetic memory according to a third embodiment.

FIG. 8 is a plan view of a magnetic memory 300 including a plurality of the spin-orbit-torque magnetoresistance effect elements 200 (refer to FIGS. 7A and 7B). In the magnetic memory 300 illustrated in FIG. 8, the spin-orbit-torque magnetoresistance effect elements 200 are arranged in a matrix of 3×3. FIG. 8 is an example of a magnetic memory, and the number of the spin-orbit-torque magnetoresistance effect elements 200 and the arrangement thereof are arbitrary.

One of word lines WL1 to WL3, one of source lines SL1 to SL3, and one of read lines RL1 to RL3 are connected to each of the spin-orbit-torque magnetoresistance effect elements 200.

When the word lines LW1 to LW3, and the source lines SL1 to SL3 are selected to apply a current, the current is allowed to flow to the spin-orbit torque wiring 20 of arbitrary spin-orbit-torque magnetoresistance effect element 200, and a write operation is performed. In addition, when the read lines RL1 to RL3, and the source lines SL1 to SL3 are selected to apply a current, the current is allowed to flow in the lamination direction of the functional part 80 of an arbitrary spin-orbit-torque magnetoresistance effect element 200, and a read operation is performed. The word lines WL1 to WL3, the source lines SL1 to SL3, and the read lines RL1 to RL3 for application of the current can be selected by a transistor and the like. That is, utilization as the magnetic memory becomes possible by reading out data of an arbitrary element from the plurality of spin-orbit-torque magnetoresistance effect elements 200.

While preferred embodiments of the disclosure have been described and illustrated above, it should be understood that these are exemplary of the disclosure and are not to be considered as limiting. Additions, omissions, substitutions, and other modifications can be made without departing from the spirit or scope of the present disclosure. Accordingly, the disclosure is not to be considered as being limited by the foregoing description, and is only limited by the scope of the appended claims.

REFERENCE SIGNS LIST 10, 10': First ferromagnetic layer
20, 20': Spin-orbit torque wiring
30: Via wiring
31: First via wiring
32: Second via wiring
40: Underlayer
50: Magnetization control layer
60: Second ferromagnetic layer
70: Nonmagnetic layer
80: Functional part
10a, 20a, 40a, 50a, 60a, 70a: First side surface
10b, 20b, 40b, 50b, 60b, 70b: Second side surface
100, 101, 102, 103: Spin-orbit-torque magnetization rotational element
100a, 102a, 103a: First inclined surface
100b, 102b, 103b: Second inclined surface
200: Spin-orbit-torque magnetoresistance element
300: Magnetic memory
θ1, θ2: Inclination angle
I, I': Write current
B: Ion beams

What is claimed is:

1. A spin-orbit-torque magnetoresistance effect element, comprising:
    a spin-orbit torque wiring that extends in a first direction;
    a first ferromagnetic layer that is located on a side of one surface of the spin-orbit torque wiring,
    wherein a side surface of the spin-orbit torque wiring and a side surface of the first ferromagnetic layer form a continuous inclined surface in any side surface,
    a second ferromagnetic layer that is disposed to face a side of the first ferromagnetic layer which is opposite to the spin-orbit torque wiring;
    a nonmagnetic layer that is interposed between the first ferromagnetic layer and the second ferromagnetic layer,
    a thickness of inside the nonmagnetic layer is thicker than a thickness of outside the nonmagnetic layer, and
    the nonmagnetic layer is constituted by an insulator.

2. The spin-orbit-torque magnetoresistance effect element according to claim 1, further comprising:
    two via wirings extending from a surface of the spin-orbit torque wiring which is opposite to the first ferromagnetic layer,
    wherein the two via wirings are located at positions at which the first ferromagnetic layer is sandwiched when viewed from the lamination direction, and partially overlap the first ferromagnetic layer.

3. The spin-orbit-torque magnetoresistance effect element according to claim 1, further comprising:
    an underlayer between the spin-orbit torque wiring and the first ferromagnetic layer,
    wherein side surfaces of the spin-orbit torque wiring, the first ferromagnetic layer, and the underlayer form a continuous inclined surface in any side surface.

4. The spin-orbit-torque magnetoresistance effect element according to claim 3,
    wherein the underlayer is amorphous.

5. The spin-orbit-torque magnetoresistance effect element according to claim 1, further comprising:
    a magnetization control layer between the spin-orbit torque wiring and the first ferromagnetic layer,
    wherein side surfaces of the spin-orbit torque wiring, the first ferromagnetic layer, and the magnetization control layer form a continuous inclined surface in any side surface.

6. The spin-orbit-torque magnetoresistance effect element according to claim 5,
    wherein a crystal structure of the magnetization control layer is tetragonal.

7. The spin-orbit-torque magnetoresistance effect element according to claim 1,
    wherein the first ferromagnetic layer and the second ferromagnetic layer have magnetic anisotropy in an in-plane direction, and axes of easy magnetization of the layers are inclined with respect to the first direction.

8. A magnetic memory, comprising:
    a plurality of the spin-orbit-torque magnetoresistance effect elements according to claim 1.

9. A magnetoresistance effect element, comprising:
    a wiring that extends in a first direction;
    a first ferromagnetic layer that is located on a side of one surface of the wiring; and
    a nonmagnetic layer that is provided on a side of one surface of the first ferromagnetic layer with the wiring or a side of other surface of the first ferromagnetic layer opposite to the wiring,
    wherein a side surface of the wiring and a side surface of the first ferromagnetic layer form a continuous inclined surface in any side surface,
    a thickness of inside the nonmagnetic layer is thicker than a thickness of outside the nonmagnetic layer, and
    the nonmagnetic layer is constituted by an insulator.

10. The magnetoresistance effect element according to the claim 9, wherein the nonmagnetic layer that is provided on the side of one surface of the first ferromagnetic layer with the wiring.

11. The magnetoresistance effect element according to claim 10, further comprising:
    two via wirings extending from a surface of the wiring which is opposite to the first ferromagnetic layer,
    wherein the two via wirings are located at positions at which the first ferromagnetic layer is sandwiched when viewed from the lamination direction, and partially overlap the first ferromagnetic layer.

12. A magnetic memory, comprising:
    a plurality of the magnetoresistance effect elements according to claim 10.

* * * * *